United States Patent
Aida et al.

(10) Patent No.: US 10,246,794 B2
(45) Date of Patent: Apr. 2, 2019

(54) DIAMOND SUBSTRATE AND METHOD FOR MANUFACTURING DIAMOND SUBSTRATE

(71) Applicant: NAMIKI SEIMITSU HOUSEKI KABUSHIKIKAISHA, Tokyo (JP)

(72) Inventors: Hideo Aida, Tokyo (JP); Koji Koyama, Tokyo (JP); Kenjiro Ikejiri, Tokyo (JP); Seongwoo Kim, Tokyo (JP)

(73) Assignee: ADAMANT NAMIKI PRECISION JEWEL CO., LTD., Tokyo (JP)

( * ) Notice: Subject to any disclaimer, the term of this patent is extended or adjusted under 35 U.S.C. 154(b) by 100 days.

(21) Appl. No.: 15/115,387

(22) PCT Filed: Feb. 2, 2015

(86) PCT No.: PCT/JP2015/052792
§ 371 (c)(1),
(2) Date: Jul. 29, 2016

(87) PCT Pub. No.: WO2015/119067
PCT Pub. Date: Aug. 13, 2015

(65) Prior Publication Data
US 2017/0009377 A1    Jan. 12, 2017

(30) Foreign Application Priority Data
Feb. 5, 2014    (JP) .................. 2014-020565

(51) Int. Cl.
*C30B 25/00* (2006.01)
*C30B 25/18* (2006.01)
(Continued)

(52) U.S. Cl.
CPC .......... *C30B 25/183* (2013.01); *C23C 16/274* (2013.01); *C23C 16/279* (2013.01);
(Continued)

(58) Field of Classification Search
CPC .......... C30B 29/04; C30B 25/02; C30B 25/18; C30B 25/20; C23C 16/27; H01L 29/1602
See application file for complete search history.

(56) References Cited

U.S. PATENT DOCUMENTS 5,270,077 A * 12/1993 Knemeyer .............. C23C 16/01
427/249.8
5,443,032 A * 8/1995 Vichr ...................... C30B 25/02
117/84
(Continued)

FOREIGN PATENT DOCUMENTS

CN    102345169    2/2012
CN    105579624    5/2016
(Continued)

OTHER PUBLICATIONS

International Search Report—PCT/JP2015/052792 dated Apr. 7, 2015.
(Continued)

*Primary Examiner* — Matthew J Song
(74) *Attorney, Agent, or Firm* — Cantor Colburn LLP

(57) ABSTRACT

The crystal plane in the interior of the diamond substrate has a curvature higher than 0 $km^{-1}$ and equal to or lower than 1500 $km^{-1}$ by preparing a base substrate, forming a plurality of pillar-shaped diamonds formed of diamond single crystals on one side of the base substrate, causing diamond single crystals to grow from tips of each pillar-shaped diamond, coalescing each of the diamond single crystals grown from the tips of each pillar-shaped diamond to form a diamond substrate layer, separating the diamond substrate layer from the base substrate, and manufacturing the diamond substrate from the diamond substrate layer.

13 Claims, 8 Drawing Sheets

(51) Int. Cl.

| | | |
|---|---|---|
| *C30B 25/02* | (2006.01) | |
| *C30B 29/04* | (2006.01) | |
| *C30B 25/20* | (2006.01) | |
| *C30B 29/60* | (2006.01) | |
| *C23C 16/27* | (2006.01) | |
| *C30B 25/10* | (2006.01) | |
| *H01L 21/02* | (2006.01) | |
| *H01L 21/78* | (2006.01) | |
| *H01L 29/04* | (2006.01) | |
| *H01L 29/16* | (2006.01) | |
| *H01L 29/34* | (2006.01) | |
| *C30B 23/02* | (2006.01) | |

(52) U.S. Cl.
CPC ............ *C30B 23/025* (2013.01); *C30B 25/02* (2013.01); *C30B 25/105* (2013.01); *C30B 25/20* (2013.01); *C30B 29/04* (2013.01); *C30B 29/605* (2013.01); *H01L 21/02527* (2013.01); *H01L 21/02609* (2013.01); *H01L 21/7806* (2013.01); *H01L 29/045* (2013.01); *H01L 29/1602* (2013.01); *H01L 29/34* (2013.01)

(56) References Cited

U.S. PATENT DOCUMENTS

| | | | | |
|---|---|---|---|---|
| 5,679,446 | A | 10/1997 | Windischmann | |
| 6,383,288 | B1 | 5/2002 | Hayashi et al. | |
| 2006/0243983 | A1* | 11/2006 | Chang | C30B 25/18 257/77 |
| 2007/0034147 | A1* | 2/2007 | Wort | C30B 23/02 117/200 |
| 2011/0315074 | A1* | 12/2011 | Noguchi | C30B 25/183 117/95 |
| 2016/0186362 | A1* | 6/2016 | Mollart | H01L 21/02376 257/618 |

FOREIGN PATENT DOCUMENTS

| | | |
|---|---|---|
| EP | 0573943 | 6/1993 |
| EP | 3054036 | 8/2016 |
| JP | 05271942 | 10/1993 |
| JP | 06183892 | 7/1994 |
| JP | 06247793 | 9/1994 |
| JP | 08133893 | 5/1996 |
| JP | 09184082 | 7/1997 |
| JP | 11199379 | 7/1999 |
| JP | 3387154 | 3/2003 |
| JP | 2004010429 | 1/2004 |
| JP | 2004111704 A * | 4/2004 ........... H01L 21/027 |
| JP | 2006306718 | 11/2006 |
| JP | 2007287771 | 11/2007 |
| JP | 2008174394 | 7/2008 |
| JP | 2010030896 | 2/2010 |
| JP | 2010222172 | 10/2010 |
| JP | 2012041258 | 3/2012 |
| JP | 5066651 | 11/2012 |
| JP | 2013249212 | 12/2013 |

OTHER PUBLICATIONS

Chinese Office Action—Chinese Application No. 201580002536.X dated Mar. 29, 2018, citing EP 0573943 and CN 102345169.
Chinese Office Action—Chinese Application No. 201580002536.X dated Oct. 16, 2017, citing CN 105579624, JP H08133893 and U.S. Pat. No. 5,679,446.
European Search Report—European Application No. 15746465.2, dated Jul. 19, 2017, citing EP 3 054 036, JP H08 133893, U.S. Pat. No. 5,579,446 and EP 0573 943.
Japanese Office Action—Japanese Application No. 2015-560966 dated Jan. 10, 2017, citing JP H08-133893, JP 2013-5249212, JP 2012-041258 and JP H06-183892.
Japanese Office Action—Japanese Application No. 2015-560966 dated Jul. 2, 2018.
Japanese Office Action—Japanese Application No. 2015-560966 dated Mar. 12, 2018.
Japanese Office Action—Japanese Application No. 2015-560966 dated May 29, 2017, citing JP H08-133893, JP 2013-249212, JP 2012-041258 and JP H06-183892.
Japanese Office Action—Japanese Application No. 2017-163820 dated Nov. 5, 2018, citing JP 06-183892, JP 06-247793, JP 2006-306718, JP 2010-030896, JP 08-133893, JP 2008-174394 and JP 09-184082.

* cited by examiner

DIAMOND SUBSTRATE AND METHOD FOR MANUFACTURING DIAMOND SUBSTRATE

TECHNICAL FIELD

The present invention relates to a diamond substrate and a method for manufacturing the diamond substrate.

BACKGROUND ART

A diamond is expected to be an ultimate semiconductor substrate. This is because a diamond has a lot of excellent characteristics, which are unparalleled in anywhere as a semiconductor material, such as high thermal conductivity, high electron/hole mobility, high dielectric breakdown field strength, a low dielectric loss, and a wide bandgap. The bandgap thereof is about 5.5 eV which is a very high value in existing semiconductor materials. Particularly, in recent years, UV light emitting elements using a wide bandgap, field effect transistors having excellent high-frequency characteristics, and the like have been developed.

When the diamond is employed as a semiconductor substrate, a flat substrate having no curvature (that is, no warp) in appearance is preferable in that axes of crystals have no inclination. In order to obtain such a diamond substrate, RAF growth method used for the SiC single-crystal growth has to be applied at the current time. The RAF growth method is a method of repeatedly growing SiC single crystals in the a-face orientation and is called Repeated a-Face (RAF) method. After an a-face single crystal is cut out from the grown ingot, and crystal is grown from the cut a-face, the cutting of a-face single crystal and the growth from the cut a-face are repeated. Then, a seed crystal is cut out from the ingot. The diamond substrate obtained using the RAF method has a size of approximately ten mm square at maximum at the current time.

When it is considered that a diamond is applied to a semiconductor, a certain size such as a diameter of several inches is required. This is because, when a processing device used for micro-machining of a general semiconductor such as Si is applied to the diamond, it is difficult to use the processing device for a small-sized substrate smaller than several inches.

Some ideas have been proposed as a method of causing a diamond having a certain size to grow. Out of the methods, there are several highlighted candidate methods such as a diamond single crystal growth method (so-called mosaic growth method; for example, see Patent Literature 1) of arranging a plurality of small diamond single-crystal substrates or a manufacturing method of forming a diamond film through a heteroepitaxial growth method on a base substrate by using a single-crystal magnesium oxide (MgO) substrate as the base substrate (for example, see Patent Literature 2).

The mosaic growth method is a technique of growing and forming a large-sized diamond single-crystal substrate by arranging a plurality of diamond single-crystal substrates in a shape of tiles and causing diamond single crystals to newly grow on the diamond single-crystal substrates through a homoepitaxial growth method. However, on the boundaries between the diamond single-crystal substrates arranged in the shape of tiles, coupling boundaries are generated and deteriorate the crystal quality. Therefore, the coupling boundaries are necessarily generated in the diamond single crystals obtained through the mosaic growth method.

The reason of formation of coupling boundary is that diamond single crystals grow randomly in the area of the coupling boundary, coalescence occurs from various directions, and a lot of dislocation are generated in the coupling boundary. This coupling boundary is a distinct boundary line which can be observed visually.

Since the part of the coupling boundary cannot be used for growth of a semiconductor device, a practically usable area is limited with respect to the area of the diamond single-crystal substrate obtained through the mosaic growth method.

To make matters worse, the area of the diamond single-crystal substrate that can be used to manufacture a semiconductor device does not necessarily match the size of a semiconductor device chip. Therefore, in a process of manufacturing a semiconductor device in such a diamond single-crystal substrate, it is necessary to perform the process to avoid the coupling boundary. Accordingly, the process of manufacturing a semiconductor device becomes complicated.

On the other hand, the heteroepitaxial growth method is a technique of causing a diamond film which will be a diamond substrate to epitaxial-grow on a base substrate formed of a material having different physical properties. Since a single diamond film epitaxial-grow on a single base substrate, there is no need to worry about a coupling boundary generated between a plurality of diamond single-crystal substrates unlike the mosaic growth method.

Therefore, out of the two techniques including the mosaic growth method and the heteroepitaxial growth method, the heteroepitaxial growth method is particularly prospective in that the area of the substrate used to manufacture a semiconductor device is not easily restricted.

However, a stress is generated in crystals of the grown diamond substrate due to a lattice constant difference and a thermal expansion coefficient difference between the base substrate and the diamond and thus a warp or a crack is generated in the diamond substrate. Accordingly, it is not easy to obtain a large-sized substrate even using the heteroepitaxial growth method.

In this regard, several techniques of the related art relevant to a decrease in the stress generated in a diamond formed through the heteroepitaxial growth method have been reported (for example, see Patent Literature 3).

Patent Literature 1: Japanese Patent No. 3387154
Patent Literature 2: Japanese Patent No. 5066651
Patent Literature 3: Japanese Unexamined Patent Application Publication No. 2007-287771

DISCLOSURE OF THE INVENTION

Technical Problem

By such techniques of the related art, diamond substrates having a size of 1.5 inches have been realized using the heteroepitaxial growth method until now. Such diamond substrates are attained by restraining a warp to the extent that a crack is not generated. However, even when the diamond substrate having a size of 1.5 inches is obtained without a crack, a discrepancy between an actual substrate surface and a crystal plane may occur in the subsequent substrate processing process, and an in-plane distribution of off angles may be generated.

Even if the warp of the diamond substrate is restrained to the level that does not generate the crack, it does not mean that the warp is non-existent. Therefore, processing is performed inevitably for the warped diamond substrate. As a result, a discrepancy is generated between an actual substrate surface and a crystal plane. That is, an in-plane distribution of the off angle is generated.

In the heteroepitaxial growth method, it is impossible to avoid a lattice constant difference and a thermal expansion coefficient difference between the base substrate and the diamond. Therefore, as illustrated in FIG. 12A, due to such differences, a substrate 103 is obtained by performing forming-processing in a flat plate shape for the diamond 102 inevitably in a state in which the base substrate 101 and the diamond 102 are warped.

In the warped state, a crystal plane of the diamond has a curvature. Therefore, inclination of the crystal axes are unable to be uniformly aligned and thus angle discrepancy is generated. In the substrate obtained from the diamond, as illustrated in the arrows of FIG. 12B, the angle discrepancy increases as the position of the substrate 103 moves from the central portion toward the edge portion and thus the angle of the crystal axes are unable to be uniformly aligned. Therefore, the angle discrepancy of crystal axes still remains without improvement.

If a semiconductor film is formed on a surface of such a substrate 103, the crystal axes of the semiconductor film are influenced from the discrepancy of the crystal axes of the substrate 103, and an angle discrepancy is generated in the crystal axes of the semiconductor film. Therefore, an in-plane deviation of the properties of the semiconductor film is unable to suppress.

If the angle of crystal axes are aligned, it is possible to suppress a generation of crystal defects. However, if a semiconductor film is formed on a surface of the diamond substrate having an angle discrepancy, the crystal axes of the semiconductor film are influenced by the discrepancy of the crystal axes of the diamond substrate. Therefore, an angle discrepancy in the crystal axis of the semiconductor film is generated, and it is unable to suppress an in-plane deviation in the properties of the semiconductor film.

In consideration of the aforementioned point, it is an object of the present invention to provide a diamond substrate capable of preventing a crack in the diamond substrate and reducing a curvature of the crystal plane in an interior of the diamond substrate to be higher than 0 km$^{-1}$ and equal to or lower than 1500 km$^{-1}$ by releasing a stress during the crystal growth.

Furthermore, it is another object of the present invention to provide a method of manufacturing the diamond substrate capable of preventing a crack in the diamond substrate and reducing a curvature of the crystal plane in an interior of the diamond substrate to be higher than 0 km$^{-1}$ and equal to or lower than 1500 km$^{-1}$ by releasing a stress during the crystal growth.

Technical Solution

The above-mentioned objects are achieved by the following present invention. That is, a diamond substrate according to the present invention is formed of diamond single crystals, wherein a crystal plane in an interior of the diamond substrate has a curvature, and the curvature is higher than 0 km$^{-1}$ and equal to or lower than 1500 km$^{-1}$.

A method of manufacturing a diamond substrate according to the present invention includes: preparing a base substrate; forming a plurality of pillar-shaped diamonds formed of diamond single crystals on one side of the base substrate; causing a diamond single crystal to grow from a tip of each pillar-shaped diamond and coalescing each of the diamond single crystals grown from the tips of each pillar-shaped diamond to form a diamond substrate layer; separating the diamond substrate layer from the base substrate; and manufacturing the diamond substrate from the diamond substrate layer, wherein a crystal plane in an interior of the diamond substrate has a curvature higher than 0 km$^{-1}$ and equal to or lower than 1500 km$^{-1}$.

Advantageous Effects

In the diamond substrate and the method of manufacturing the same according to the present invention, the diamond substrate layer is separated from the base substrate by destroying the pillar-shaped diamonds during the growth of the diamond substrate layer. Therefore, even when a stress generated in the diamond substrate layer increases, the stress of the diamond substrate layer is released to the outside due to the destruction of the pillar-shaped diamonds. Therefore, it is possible to suppress generation of crystal distortion in the diamond substrate layer and an angle discrepancy of the crystal axes in the interior of the diamond substrate layer. As a result, the curvature of the crystal plane in the interior of the diamond substrate layer can be within a certain range (higher than 0 km$^{-1}$ and equal to or smaller than 1500 km$^{-1}$) and it is possible to improve uniformity of the inclination (off angle) of the crystal plane in the interior of the diamond substrate.

Since it is possible to suppress the crystal axes of the semiconductor film formed on a surface of the diamond substrate from being influenced by a discrepancy of the crystal axis of the diamond substrate, it is possible to reduce an angle discrepancy of the crystal axis of the semiconductor film and suppress an in-plane deviation in the properties of the semiconductor film.

Since a stress of the diamond substrate layer is released to the outside by destroying the pillar-shaped diamonds, it is possible to prevent generation of a crack in the diamond substrate layer and the diamond substrate.

BEST MODE FOR CARRYING OUT THE INVENTION

Hereinafter, a diamond substrate according to the present invention will be described in detail with reference to FIG. 1. A shape of the diamond substrate in an in-plane direction according to the present invention is not particularly limited and may be, for example, a rectangular shape and the like. However, a circular shape is preferably employed from the viewpoint of easy use in processes of manufacturing a surface acoustic wave element, a thermistor, a semiconductor device, and the like. Particularly, as illustrated in FIG. 1, a circular shape provided with an orientation flat plane is preferable.

Figure 1:
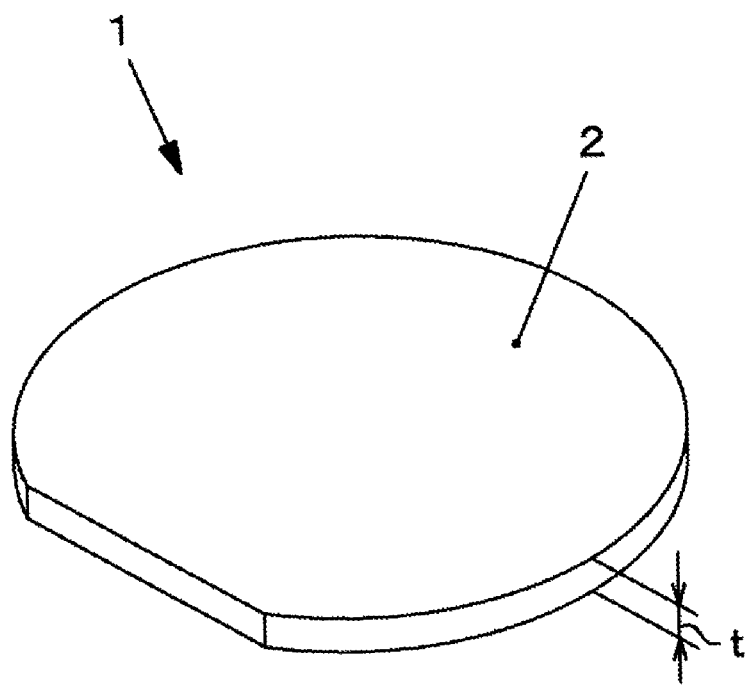
FIG. 1 is a perspective view illustrating an example of a diamond substrate according to an embodiment of the invention.

When the diamond substrate 1 has a circular shape or a circular shape provided with an orientation flat plane as illustrated in FIG. 1, a diameter is preferably 0.4 inches (about 10 mm) or larger from the viewpoint of an increase in size. In addition, from the viewpoint of an increase in size of a practical substrate, the diameter is preferably 2 inches (about 50.8 mm) or larger, more preferably 3 inches (about 76.2 mm) or larger, and still more preferably 6 inches (about 152.4 mm) or larger. In consideration of a dimensional tolerance of the diamond substrate 1, in this specification, a diameter range of 49.8 mm, which is obtained by subtracting 1.0 mm corresponding to 2% of 50.8 mm from 2 inches, to 50.8 mm is defined to correspond to 2 inches.

An upper limit of the diameter is not particularly limited, but is preferably 8 inches (about 203.2 mm) or smaller in terms of practical use. In order to manufacture a lot of elements or devices at a time, a rectangular diamond substrate having an area equal to or larger than a diameter of 2 inches may be employed.

Therefore, a surface 2 of the diamond substrate 1 has a surface area of at least 0.78 cm$^2$. From the viewpoint of an increase in size, the surface preferably has a surface area of 20 cm$^2$ to 1297 cm$^2$.

A thickness t of the diamond substrate 1 may be set arbitrarily. For example, the thickness t of the diamond substrate 1 is preferably 3.0 mm or smaller in terms of a self-supported substrate, and more preferably 1.5 mm or smaller and still more preferably 1.0 mm or smaller for use in a manufacturing line of elements or devices. Meanwhile, a lower limit of the thickness t is not particularly limited. For example, the lower limit of thickness t is preferably 0.05 mm or larger and more preferably 0.3 mm or larger from the viewpoint of securing of rigidity of the diamond substrate 1 to prevent a fissure, a fracture, or a crack.

Here, the "self-supported substrate" or "self-support substrate" in the present invention refers to a substrate having a strength that is not only suitable for maintaining its own shape but also has no problem in handling. The thickness t is preferably set to 0.3 mm or larger in order to provide such a strength. Since a diamond is a very hard material, the upper limit of the thickness t as a self-supported substrate is preferably 3.0 mm or smaller in consideration of easiness in cleavage after formation of elements or devices or the like. In terms of a self-supported substrate which can be most frequently used for elements or devices, the thickness t is most preferably 0.5 mm or larger and 0.7 mm or smaller (500 μm or larger and 700 μm or smaller).

Diamond single crystals are preferably employed as the diamond crystals for forming the diamond substrate 1. The diamond single crystals may be any of Ia type, IIa type, and IIb type. The Ia type is more preferably employed when the diamond substrate 1 is used as a substrate of a semiconductor device from the viewpoint quantity of generated crystal defects or distortion. In addition, it is assumed that the diamond substrate 1 is formed from a single diamond single crystal, and coupling boundaries at which a plurality of diamond single crystal is coupled are not generated on the surface 2.

The surface 2 of the diamond substrate 1 is subjected to lapping, polishing, or chemical mechanical polishing (CMP). On the other hand, the rear surface of the diamond substrate 1 is subjected to lapping and/or polishing. The surface 2 is processed mostly for obtaining a flat substrate shape, and the rear surface is processed mostly for obtaining a desired thickness t. Since the surface 2 is desired to have surface roughness Ra enough to form elements or devices, the surface roughness Ra is preferably lower than 1 nm and more preferably equal to or lower than 0.1 nm at which the surface is flattened at an atomic level. The surface roughness Ra is measured using a surface roughness measuring instrument.

When the diamond substrate 1 is formed of single crystals, the plane orientation of a crystal plane of the surface 2 may be any one of (111), (110), and (100), but not limited thereto. The plane orientation (100) is preferable because the orientation (100) is most frequently employed for formation of elements or devices, growth of diamond single crystals, or the like.

Figure 11:
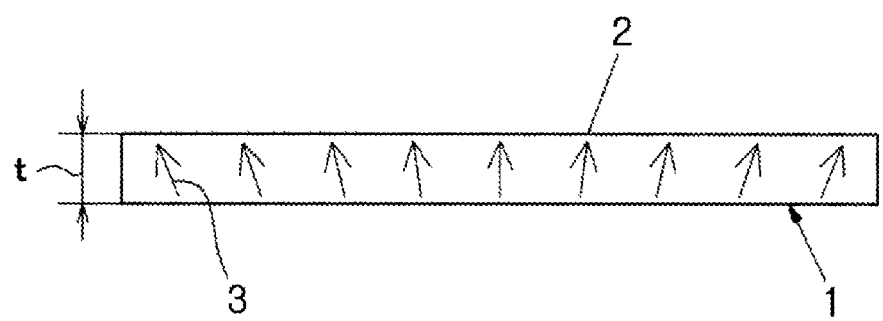
FIG. 11 is a schematic diagram illustrating an example of angles of crystal axes of a diamond substrate according to an embodiment of the invention.
Figure 12A:
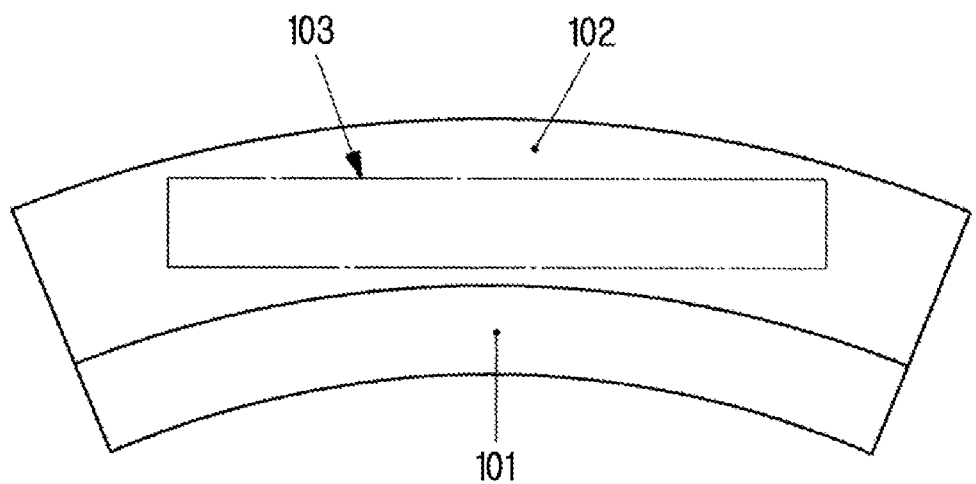
FIG. 12A is a schematic diagram illustrating a state of a base substrate and diamonds in a heteroepitaxial growth method.
Figure 12B:
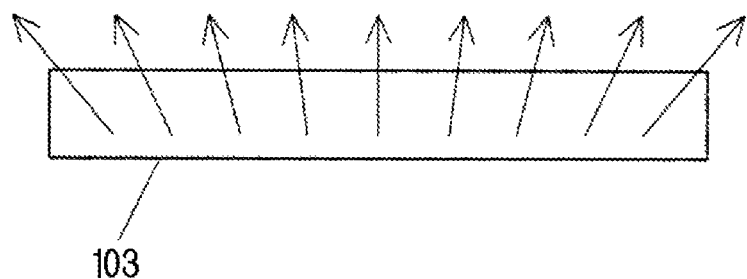
FIG. 12B is a schematic diagram illustrating exemplary of angles of the crystal axes of the diamond substrate obtained from the diamonds of FIG. 12A.

In the diamond substrate according to the present invention, it is assumed that a crystal plane in the interior of the substrate 1 that is not exhibited on the surface 2 is warped over a range of the edge to the center of the substrate 1 and has a curvature. That is, although the front surface 2 and the rear surface of the diamond substrate 1 are formed in a flat plate shape that is formed in parallel and evenly in appearance, angle discrepancy of the crystal axes 3 in the interior of the substrate 1 increases as the position moves from the center to the edge of the substrate 1 as illustrated in FIG. 11. In the diamond substrate 1 according to the present invention, the angle discrepancy of the crystal axes 3 in the interior of the substrate is allowed. However, the present invention is characterized in that the curvature of the crystal plane in the interior of the substrate 1 is within a certain range. The crystal plane of the interior of the substrate 1 may have any plane and (001) may be included as an example. The plane (001) is preferable because polishing can be easily performed, and an inclination can be easily provided at a slight angle.

According to the present invention, the curvature of the crystal plane in the interior of the substrate 1 that is not exhibited on the surface 2 is set to be higher than 0 km$^{-1}$ and equal to or lower than 1500 km$^{-1}$. By setting the curvature within higher than 0 km$^{-1}$ and equal to or lower than 1500 km$^{-1}$, it is possible to improve uniformity of the inclination (off angle) of the crystal plane in the interior of the substrate 1. In particular, that is effective in a diamond substrate having a thickness t of 0.5 mm or larger and 0.7 mm or smaller which is most frequently employed to form elements or devices or grow diamond single crystals. Therefore, it is possible to suppress the crystal axes of the semiconductor film formed on the surface 2 from being influenced by the discrepancy of the crystal axes of the diamond substrate 1. Furthermore, the angle discrepancy in the crystal axes of the semiconductor film is reduced, so that it is possible to suppress an in-plane deviation in the properties of the semiconductor film. It is impossible to obtain the aforementioned uniformity if the curvature is higher than 1500 km$^{-1}$.

Since the angle discrepancy in the crystal axes of the semiconductor film is reduced, unevenness of the semiconductor film generated by the angle discrepancy is also reduced, and defects that may be generated by the unevenness is reduced accordingly. Since the angle discrepancy of the crystal axes 3 of the surface 2 of the substrate 1 is reduced, unevenness generated on the surface 2 is also suppressed. Accordingly, a crystal defect of the surface 2 is suppressed, and a surface defect density is reduced. The curvature is measured using an atomic force microscope (AFM), X-ray diffraction, and the like.

By setting the curvature of the crystal plane in the interior of the substrate 1 to be higher than 0 km$^{-1}$ and equal to or lower than 400 km$^{-1}$, it is possible to reduce the inclination angle of the crystal plane in the interior of the substrate 1 between both ends of the diamond substrate 1 having a diameter of 2 inches, to approximately 1°. Therefore, it is possible to further improve the uniformity of the inclination (off angle).

By setting the curvature of the crystal plane in the interior of the substrate 1 to be higher than 0 km$^{-1}$ and equal to or lower than 200 km$^{-1}$, it is possible to reduce the inclination angle of the crystal plane in the interior of the substrate 1 between both ends of the diamond substrate 1 having a diameter of 2 inches, to approximately 0.5°. Therefore, it is possible to further improve uniformity of the inclination (off angle).

Figure 2:
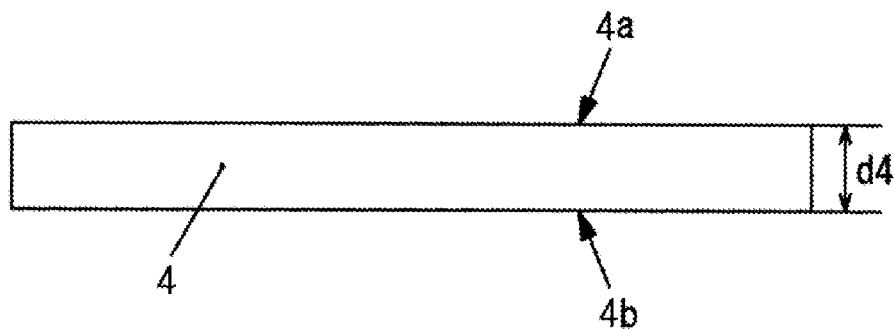
FIG. 2 is a schematic diagram illustrating a base substrate according to the embodiment of the invention.

Next, a method of manufacturing a diamond substrate according to the present invention will be described in detail with reference to FIGS. 2 to 9. First, a base substrate 4 is prepared as illustrated in FIG. 2. As material of the base substrate, for example, magnesium oxide (MgO), aluminum oxide (α—Al$_2$O$_3$: sapphire), Si, quartz, platinum, iridium, strontium titanate (SrTiO$_3$), and the like may be included.

Among these materials, particularly, since an MgO single-crystal substrate and an aluminum oxide (sapphire) single-crystal substrate are very thermally stable, and are produced as the substrate with diameter of up to 8 inches (about 203.2 mm) and thus easily available, the MgO single-crystal substrate and the aluminum oxide single-crystal substrate are preferably employed as a base substrate for growing the diamond single crystals.

The base substrate 4 of which at least one side 4a is mirror-polished is used. In a process of growing a diamond layer described later, the diamond layer is grown and formed on the mirror-polished surface (on the surface of the one side 4a). A base substrate of which both one side 4a and back side 4b are mirror-polished may be used as necessary. In this case, any one side can be arbitrarily used as a diamond layer growing surface.

The mirror polishing may be performed such that the surface is smoothed to enable a diamond layer to grow on at least the one side 4a, and is preferably performed such that surface roughness Ra is equal to or less than 10 nm as a reference. If the surface roughness Ra of the one side 4a is higher than 10 nm, the quality of the diamond layer grown on the one side 4a is degraded. Furthermore, there is no crack on the one side 4a. The surface roughness Ra is measured using a surface roughness measuring instrument.

When the MgO single-crystal substrate is employed as the base substrate 4, the diamond layer growth plane preferably has an (001) plane. Planes other than (001) may also be employed.

A shape of the base substrate 4 in the in-plane direction is not particularly limited. For example, the base substrate 4 may have a circular shape or a rectangular shape. If the base substrate 4 has a circular shape, the diameter of the base substrate 4 is preferably equal to or larger than 0.4 inches (about 10 mm) from the viewpoint of an increase in size. Furthermore, from the viewpoint of an increase in size of a practical substrate, the diameter of the base substrate 4 is preferably equal to or larger than 2 inches (about 50.8 mm), more preferably equal to or larger than 3 inches (about 76.2 mm), and still more preferably equal to or larger than 6 inches (152.4 mm). The upper limit of the diameter is not particularly limited, and is preferably equal to or smaller than 8 inches in terms of practical use. In consideration of a dimensional tolerance of the base substrate 4, in this specification a diameter range of 49.8 mm, which is obtained by subtracting 1.0 mm corresponding to 2% of 50.8 mm from 2 inches, to 50.8 mm is defined to correspond to 2 inches.

On the other hand, if the base substrate 4 has a rectangular shape, the size of the base substrate 4 is preferably equal to or larger than 10 mm×10 mm, more preferably equal to or larger than 50 mm×50 mm, and still more preferably equal to or larger than 75 mm×75 mm from the viewpoint of an increase in size. The upper limit of the size is preferably equal to or smaller than 200 mm×200 mm in terms of practical use.

Therefore, the surface of the base substrate 4 has at least a surface area of 1 cm$^2$. From the viewpoint of an increase in size, the surface preferably has a surface area of 20 to 1297 cm$^2$.

The thickness d4 of the base substrate 4 is preferably equal to or smaller than 3.0 mm, more preferably equal to or smaller than 1.5 mm, and still more preferably equal to or smaller than 1.0 mm. The lower limit of the thickness d4 is not particularly limited, but is preferably equal to or larger than 0.05 mm and more preferably equal to or larger than 0.4 mm from the viewpoint of securing of rigidity of the base substrate 4. If the base substrate 4 having a circular shape in the in-plane direction has a diameter equal to or larger than 10 mm and equal to or smaller than 150 mm, the thickness d4 is preferably equal to or larger than 0.3 mm. If the diameter is larger than 150 mm, the thickness d4 is preferably equal to or larger than 0.6 mm.

Figure 3:
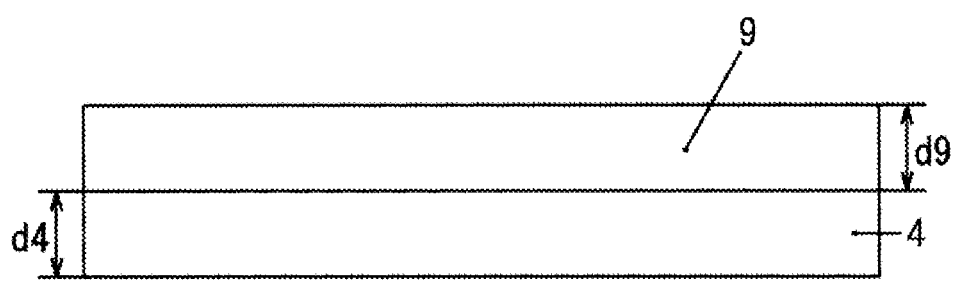
FIG. 3 is a schematic diagram illustrating a state of the base substrate provided with a diamond layer according to the embodiment of the invention.
Figure 4:
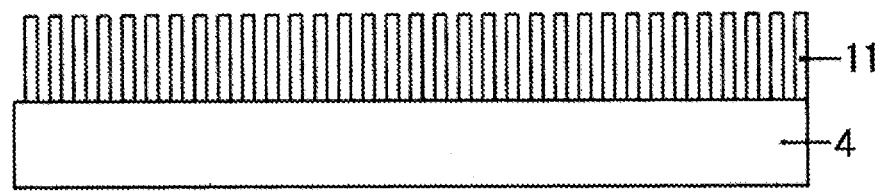
FIG. 4 is a schematic diagram illustrating a base substrate having a plurality of pillar-shaped diamonds formed thereon.
Figure 5:
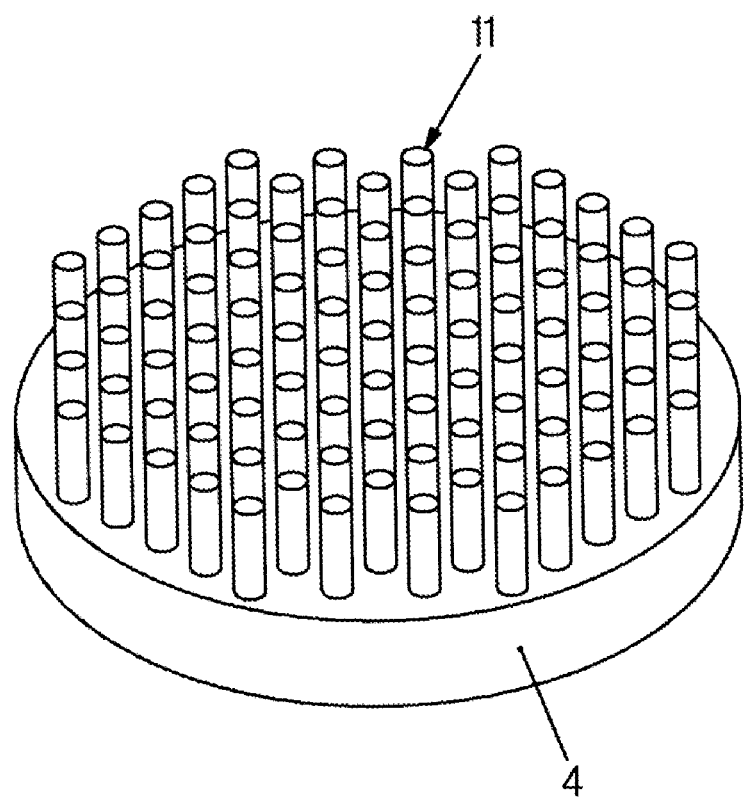
FIG. 5 is a perspective view schematically illustrating a base substrate having a plurality of pillar-shaped diamonds formed thereon.
Figure 6:
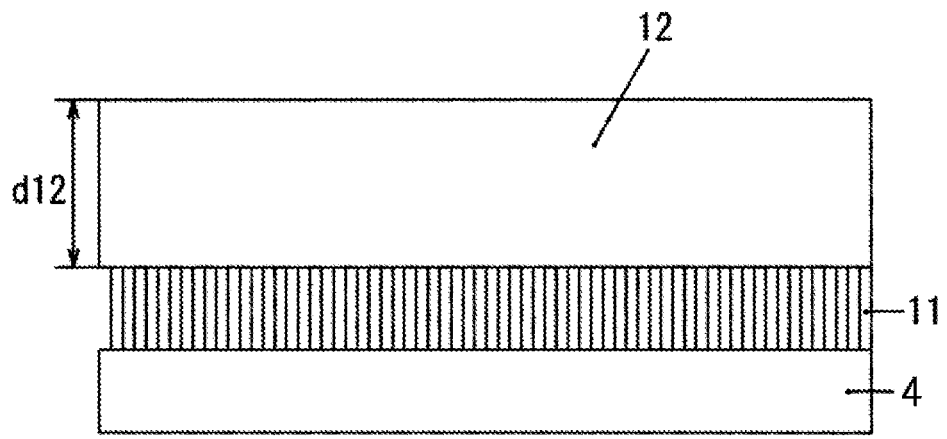
FIG. 6 is a schematic diagram illustrating a base substrate provided with pillar-shaped diamonds having a diamond substrate layer formed thereon.
Figure 7:
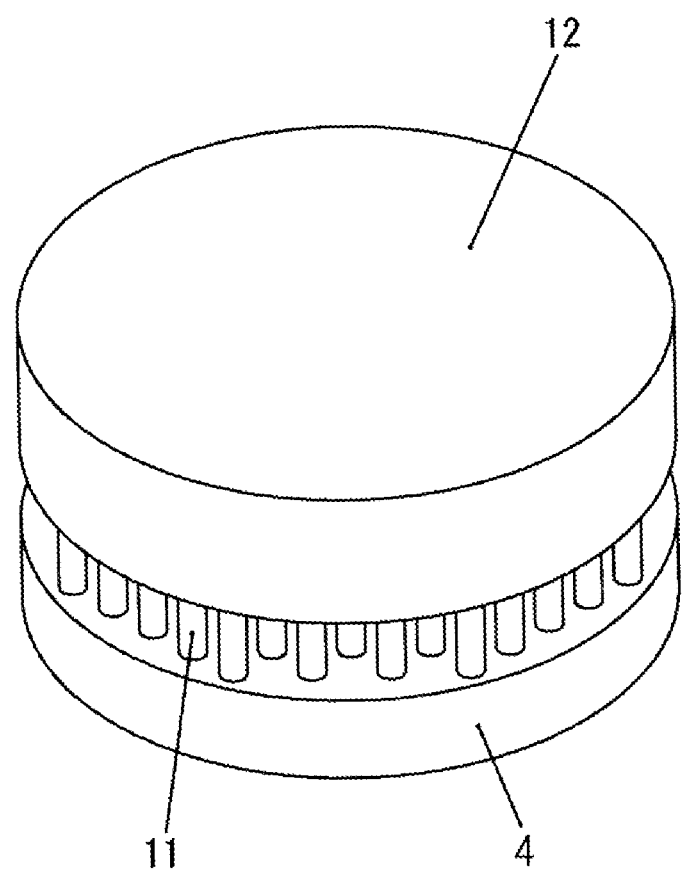
FIG. 7 is a perspective view schematically illustrating a base substrate provided with pillar-shaped diamonds and a diamond substrate layer formed thereon.

After the base substrate 4 is prepared, a diamond layer 9 formed of diamond single crystals grows and is formed on the one side 4a as illustrated in FIG. 3. The method of causing the diamond layer 9 to grow is not particularly limited, and a known method may be employed. As specific examples of growth method, vapor phase growth methods such as a pulse laser deposition (PLD) method and a chemical vapor deposition (CVD) method may be preferably employed.

The base substrate 4 is subjected to thermal cleaning before the diamond layer 9 grows, and then the diamond layer 9 is made to grow. In the PLD method, laser sputtering is performed on a target containing graphite, amorphous carbon, or diamond in the atmosphere of gas composed substantially of oxygen, so that carbon is scattered out of the target, and the diamond layer 9 is made to grow on the one side 4a of the base substrate 4. It is preferable that a furnace pressure range from $1.33 \times 10^{-4}$ Pa to 133.32 Pa, a temperature of the base substrate 4 range from 300° C. to 1000° C., and a distance between the target and the base substrate 4 is set to 10 mm to 100 mm.

In the aforementioned CVD method, the base substrate 4 is disposed in a CVD growth furnace, and CVD diamond single crystals are made to grow on the one side 4a of the base substrate 4. As the growth method, a DC plasma method, a hot filament method, a combustion flame method, an arc jet method, or the like may be employed, and a microwave plasma method is preferably employed to obtain a diamond with high quality in which mixing amount of impurities is small.

In the epitaxial growth of the diamond layer 9 using the microwave plasma CVD method, a gas containing hydrogen and carbon is employed as a raw material gas. Methane as the gas containing hydrogen and carbon is introduced into the growth furnace at a methane/hydrogen gas flow ratio of 0.001% to 30%. The furnace pressure is kept at about $1.3 \times 10^3$ Pa to $1.3 \times 10^5$ Pa, and microwaves of a frequency of 2.45 GHz (±50 MHz) or 915 MHz (±50 MHz) are applied with power of 100 W to 60 kW to generate plasma. Active species are deposited on the one side 4a of the base substrate 4 while the temperature is kept at 700° C. to 1300° C. by heating from the plasma, so that CVD diamonds are made to grow.

An iridium (Ir) single-crystal film may be formed on the surface of the base substrate 4 as a pre-treatment before the growth of the diamond layer 9, and the diamond layer 9 may be grown on the Ir single-crystal film.

The thickness d9 of the diamond layer 9 illustrated in FIG. 3 is set to the height of the pillar-shaped diamond to be formed, and the is preferably set to a thickness equal to or larger than 30 μm and equal to or smaller than 500 μm.

Then, a plurality of pillar-shaped diamonds 11 are formed from the diamond layer 9. In the formation, the pillar-shaped diamonds 11 may be formed through etching, photolithography, laser machining, or the like.

Since the diamond layer 9 is formed on the base substrate 4 through the heteroepitaxial growth, a lot of crystal defects are generated in the diamond layer 9. However, the defects can be thinned out by forming a plurality of pillar-shaped diamonds 11.

Then, a diamond substrate layer 12 is grown and formed on the tips of the pillar-shaped diamonds 11. By causing diamond single crystals to grow from the tips of each of the pillar-shaped diamonds 11, diamond single crystals can be grown uniformly at any pillar-shaped diamond 11. By causing the diamond single crystals to grow in a direction transverse to the height direction of each pillar-shaped diamonds 11, coalescence of the diamond single crystals growing from the pillar-shaped diamonds 11 can be started at the same timing.

The diamond substrate layer 12 is manufactured by coalescing the diamond single crystals growing from the pillar-shaped diamonds 11 with each other. The number of pillar-shaped diamonds 11 that can be formed varies depending on the diameter of the base substrate 4, and the number of pillar-shaped diamonds 11 can increase as the diameter of the base substrate 4 increases. Therefore, a diamond substrate layer having a diameter of 0.4 inches can be manufactured from a base substrate having a diameter of 0.4 inches, and a diamond substrate layer having a diameter of 8 inches can be manufactured from a base substrate having a diameter of 8 inches.

By setting the pitch of the pillar-shaped diamonds 11 to the same gap (pitch) as growing of cores of the diamond single crystals, and causing diamond single crystals to grow from each of the pillar-shaped diamonds, it is possible to improve the surface quality of the diamond substrate layer 12. By setting the diameter and the pitch of the pillar-shaped diamonds 11 to 10 μm or smaller, it is possible to improve the surface quality of the diamond substrate layer 12.

The pitch of the pillar-shaped diamonds 11 may be appropriately selected. Preferably, the pitch may be appropriately selected from the viewpoint whether the coalescence of the diamond single crystals growing from each of the pillar-shaped diamonds 11 is started at the same timing.

After the formation of the diamond substrate layer 12, the diamond substrate layer 12 is separated from the base substrate 4 at the part of the pillar-shaped diamonds 11. In order to separate the diamond substrate layer 12 at the part of the pillar-shaped diamonds 11, it is necessary to apply a certain force to the part of the pillar-shaped diamonds 11. According to the present invention, a stress is generated in the pillar-shaped diamonds 11 by a warp generated in the base substrate 4 and the diamond substrate layer 12 during the growth of the diamond substrate layer 12, and the pillar-shaped diamonds 11 are destroyed by the stress to separate the diamond substrate layer 12 from the base substrate 4.

Figure 8:
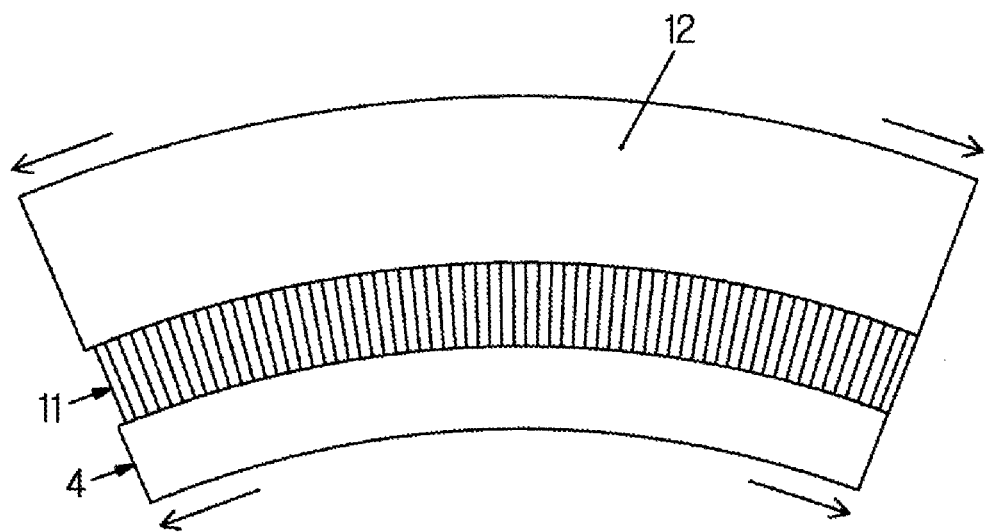
FIG. 8 is schematic diagram illustrating a diamond substrate layer, a base substrate, and the pillar-shaped diamond which warp in a convex shape due to a tensile stress.

For example, as illustrated in FIG. 8, the base substrate 4 formed from MgO single crystals has a thermal expansion coefficient and a lattice constant higher than those of the diamond substrate layer 12 formed from diamond single crystals. Accordingly, when the diamond substrate layer 12 is cooled after the growth, a tensile stress is generated from the center to the edge on the diamond substrate layer 12 side as indicated by the arrows. The tensile stress is generated due to a stress generated by a lattice constant difference between the base substrate 4 and the diamond substrate layer 12 and/or a thermal expansion coefficient difference between the base substrate 4 and the diamond substrate layer 12. As a result, all of the diamond substrate layer 12, the base substrate 4, and the pillar-shaped diamonds 11 are warped significantly such that the diamond substrate layer 12 side is convex as illustrated in FIG. 8.

Figure 9:
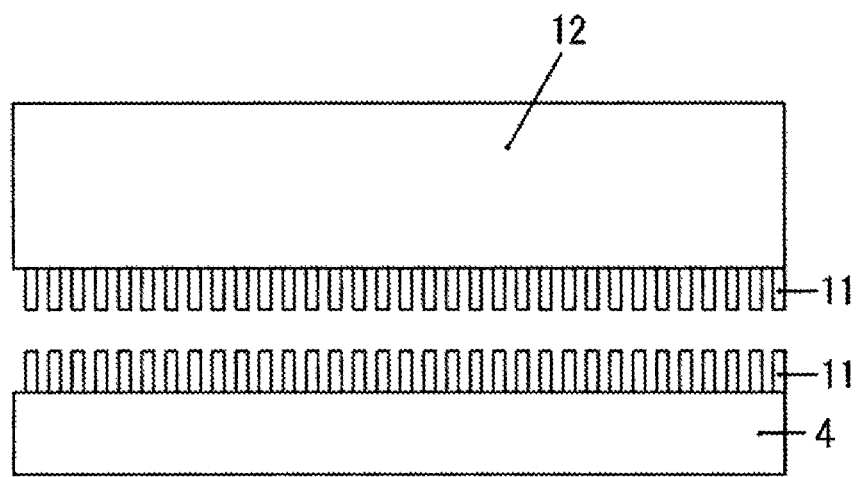
FIG. 9 is a schematic diagram illustrating a state in which the diamond substrate layer is separated from the base substrate by destroying the pillar-shaped diamonds.

A large tensile stress is applied to each of the pillar-shaped diamonds 11, so that a crack is generated in the pillar-shaped diamonds 11. As the crack is progressed, the pillar-shaped diamonds 11 are destroyed as illustrated in FIG. 9, and the diamond substrate layer 12 is separated from the base substrate 4.

Even when the stress generated in the diamond substrate layer 12 increases with an increase in size of the diamond substrate layer 12, the stress of the diamond substrate layer 12 is released to the outside by the destruction of the pillar-shaped diamonds 11. Therefore, it is possible to prevent a crack from being generated in the diamond substrate layer 12 and thus manufacture a large-sized diamond substrate 1.

Since the stress generated by a lattice constant difference between the base substrate 4 and the diamond substrate layer 12 and/or the stress generated by a thermal expansion coefficient difference between the base substrate 4 and the diamond substrate layer 12 are used for the separation, a device, a mechanism, or a process for separation is not particularly necessary after the growth of the diamond substrate layer 12. Accordingly, it is possible to simplify the process of manufacturing the diamond substrate 1 and facilitate the separation process.

Preferably, the height direction of the pillar-shaped diamond 11 is set to be perpendicular to the plane (001) of the diamond single crystals used to form the diamond layer 9 and the pillar-shaped diamond 11 because destruction of the pillar-shaped diamonds 11 due to application of a stress can smoothly progress.

Figure 10:
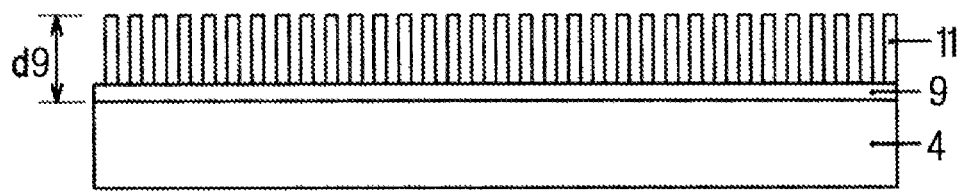
FIG. 10 is a schematic diagram illustrating another example of a base substrate having a plurality of pillar-shaped diamonds formed thereon.

The thickness d9 of the diamond layer 9 shown in the FIG. 3 is set to match the height of the pillar-shaped diamond to be formed and is preferably set to a thickness equal to or larger than 30 μm and equal to or smaller than 500 μm. As illustrated in FIG. 10, the pillar-shaped diamonds 11 may be formed in a state in which a part of the diamond layer 9 corresponding to a partial thickness of the lower part of the thickness d9 remains.

An aspect ratio of the pillar-shaped diamonds 11 in FIGS. 4 to 10 is set to a value at which the pillar-shaped diamonds 11 are not fully filled during the growth of the diamond substrate layer 12 and specifically, is preferably may be set to 5 or higher.

The cross-sectional shape of the pillar-shaped diamonds 11 may be a rectangular shape or circular shape. However, the pillar-shaped diamonds 11 need to be rapidly destroyed when a stress is applied. In consideration of the aforementioned description, it is preferable that the cross-sectional shape of the pillar-shaped diamonds 11 is a circular shape (that is, each pillar-shaped diamond 11 has a cylindrical shape) because the stress is uniformly applied in the circumferential direction to uniformly destroy the pillar-shaped diamonds 11. Therefore, it is possible to prevent generation of a fissure, a fracture, a crack, or the like in the diamond substrate layer 12 by non-uniform destruction. Therefore, the circular cross-sectional shape is more preferable.

Preferably, the diameter of each pillar-shaped diamond 11 is set to a submicron level to about 5 μm, and the diameter of the central portion of each pillar-shaped diamond in the height direction is formed to be smaller than the diameter of the tip portion because the pillar-shaped diamond 11 can be more easily and smoothly destroyed.

After the diamond substrate layer 12 is separated from the base substrate 4, the diamond substrate layer 12 is polished to remove the remaining pillar-shaped diamonds 11, and a disk is cut out by slicing and circular punching. By performing various processing such as lapping, polishing, and CMP and mirror polishing on the disk as necessary, the diamond substrate 1 is manufactured from the diamond substrate layer 12. Accordingly, the thickness d12 of the diamond substrate layer 12 is set to be slightly larger than the thickness t in consideration of a polishing margin and the like. Since the diamond is a material having highest hardness, the polishing margin is preferably set to be as small as possible from the viewpoint of difficulty in polishing. For example, the polishing margin may be set to 50 μm.

As described above, in the method of manufacturing the diamond substrate 1 according to the present invention, the diamond substrate layer 12 is separated from the base substrate 4 by destroying the pillar-shaped diamonds 11 during the growth of the diamond substrate layer 12. Therefore, even when the stress generated in the diamond substrate layer 12 increases, the stress of the diamond substrate layer 12 is released to the outside due to the destruction of the pillar-shaped diamonds 11. Accordingly, it is possible to suppress a distortion of the crystals in the diamond substrate layer 12 and an angle discrepancy of the crystal axes in the interior of the diamond substrate layer 12. As a result, it is possible for the curvature of the crystal plane in the interior of the diamond substrate layer 12 to be within a certain range (to be higher than 0 $km^{-1}$ and equal to or lower than 1500 $km^{-1}$), and thus it is possible to improve uniformity of the inclination (off angle) of the crystal plane in the interior of the diamond substrate 1.

Since the stress of the diamond substrate layer 12 is released to the outside by destroying the pillar-shaped diamond 11, it is possible to prevent a generation of the crack in the diamond substrate layer 12 and the diamond substrate 1.

EXPLANATION ON REFERENCE NUMERALS 1 diamond substrate
2 surface of diamond substrate
3 crystal axis in interior of diamond substrate
4 base substrate
4a one side of base substrate
4b rear surface of base substrate
9 diamond layer
11 pillar-shaped diamond
12 diamond substrate layer
t thickness of diamond substrate
d4 thickness of base substrate
d9 thickness of diamond layer
d12 thickness of diamond substrate layer

The invention claimed is:

1. A method of manufacturing a diamond substrate, comprising:
preparing a base substrate;
forming a diamond layer formed from diamond single crystals on one side of the base substrate;
removing a part of the diamond layer to leave a plurality of pillar-shaped diamonds from the diamond layer, the plurality of pillar-shaped diamonds being spaced apart to each other;
causing the diamond single crystals to grow from tips of each pillar-shaped diamond while a space between the plurality of pillar-shaped diamonds are not fully filled and coalescing each of the diamond single crystals grown from the tips of each pillar-shaped diamonds to form a diamond substrate layer;
separating the diamond substrate layer from the base substrate; and
manufacturing the diamond substrate from the diamond substrate layer,
wherein a curvature of a crystal plane in an interior of the diamond substrate is set to higher than 0 $km^{-1}$ and equal to or lower than 1500 $km^{-1}$.

2. The method according to claim 1, wherein separation of the base substrate and the diamond substrate layer is performed by generating a stress in the pillar-shaped diamonds and destroying the pillar-shaped diamonds.

3. The method according to claim 2, wherein the stress is generated by a lattice constant difference between the base substrate and the diamond substrate layer and/or a thermal expansion coefficient difference between the base substrate and the diamond substrate layer.

4. The method according to claim 1, wherein an aspect ratio of each of the pillar-shaped diamond is equal to or higher than 5.

5. The method according to claim 1, wherein a diameter and a pitch of the pillar-shaped diamond are set to be equal to or smaller than 10 respectively.

6. The method according to claim 1, wherein a surface roughness Ra of the one side of the base substrate is equal to or lower than 10 nm.

7. The method according to claim 1, wherein a height direction of the pillar-shaped diamond is set to be perpendicular to the plane (001) of the diamond single crystals used to form the pillar-shaped diamonds.

8. The method according to claim 1, wherein the pillar-shaped diamond has a cylindrical shape, and
a diameter of a center portion of the pillar-shaped diamond in the height direction is thinner than a diameter of a tip portion.

9. The method according to claim 1, wherein the curvature is set to be higher than 0 $km^{-1}$ and equal to or lower than 400 $km^{-1}$.

10. The method according to claim 1, wherein the curvature is set to be higher than 0 $km^{-1}$ and equal to or lower than 200 $km^{-1}$.

11. The method according to claim 1, wherein a shape of the diamond substrate in an in-plane is a circular shape or a circular shape having an orientation flat plane, and
a diameter of the diamond substrate is equal to or larger than 0.4 inches.

12. The method according to claim 11, wherein the diameter is equal to or larger than 2 inches.

13. The method according to claim 11, wherein the diameter is equal to or larger than 2 inches and equal to or smaller than 8 inches.

* * * * *